(12) United States Patent
Su

(10) Patent No.: US 8,542,498 B2
(45) Date of Patent: Sep. 24, 2013

(54) SHIELDING ENCLOSURES

(75) Inventor: Wanfa Su, Shanghai (CN)

(73) Assignee: Laird Technologies, Inc., Earth City, MO (US)

( * ) Notice: Subject to any disclaimer, the term of this patent is extended or adjusted under 35 U.S.C. 154(b) by 471 days.

(21) Appl. No.: 12/895,307

(22) Filed: Sep. 30, 2010

(65) Prior Publication Data

US 2011/0073360 A1    Mar. 31, 2011

(30) Foreign Application Priority Data

Sep. 30, 2009   (CN) .......................... 2009 1 0174144

(51) Int. Cl.
*H05K 9/00*      (2006.01)
(52) U.S. Cl.
USPC .......................................... 361/816; 361/818
(58) Field of Classification Search
USPC ................................................. 361/816, 818
See application file for complete search history.

(56) References Cited

U.S. PATENT DOCUMENTS

| | | | |
|---|---|---|---|
| 7,109,411 B2 | 9/2006 | Vinokor et al. | |
| 7,285,732 B2 | 10/2007 | Vinokor et al. | |
| 7,345,248 B2 | 3/2008 | Vinokor et al. | |
| 2008/0000683 A1* | 1/2008 | Vinokor et al. | 174/382 |

* cited by examiner

*Primary Examiner* — Jeremy Norris
(74) *Attorney, Agent, or Firm* — Harness, Dickey & Pierce, P.L.C.

(57) ABSTRACT

Disclosed herein are various exemplary embodiments of shielding enclosures. In an exemplary embodiment, a shielding enclosure generally includes a frame and a lid. The frame includes vertically extending sidewalls and horizontally inwardly extending lateral flanges therefrom. The lateral flanges define a top opening of the frame and include outwardly extending detent legs. The lid includes a top portion for covering the top opening of the frame. The lid also includes flanges downwardly extending from edges of the top portion. At least one of the flanges has a detent structure, such that when the lid is installed on the frame the detent legs of the frame are engaged by the detent structure. The detent structure may, for example, be detent slots or detent protrusions.

20 Claims, 5 Drawing Sheets

100

US 8,542,498 B2

SHIELDING ENCLOSURES

CROSS-REFERENCE TO RELATED APPLICATION

This application claims the benefit and priority of Chinese Patent Application No. 200910174144.8 filed Sep. 30, 2009. The entire disclosure of the above application is incorporated herein by reference.

FIELD

The present disclosure relates to electromagnetic interference (EMI) shielding enclosures for shielding electronic components and/or circuitry within electronic devices, such as a shielding enclosure for a mobile phone, the shielding enclosure having a lower height.

BACKGROUND

This section provides background information related to the present disclosure which is not necessarily prior art.

Electronic equipment often generates electromagnetic signals in one portion of the electronic equipment that may radiate to and interfere with another portion of the electronic equipment. This electromagnetic interference (EMI) can cause degradation or complete loss of important signals, thereby rendering the electronic equipment inefficient or inoperable. To reduce the adverse effects of EMI, electrically conducting (and sometimes magnetically conducting) material is interposed between the two portions of the electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit that is susceptible to the electromagnetic signal. For example, electronic circuits or components of a printed circuit board (PCB) are often enclosed with shields to localize EMI within its source, and to insulate other devices proximal to the EMI source.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

Nowadays, printed circuit boards (PCBs) are widely used in the electronics and communications devices, generally as substrates for mounting of electronic components. The PCBs generally include one or more layers of an insulating substrate on which an electrical circuit is formed by depositing a predetermined pattern of a conducting metal (e.g., copper, etc.) for connecting various electronic components (e.g., semiconductor components, etc.), which are mounted on or embedded in the PCB layers. Such electrical circuits include components which can operate at a high radio frequency (RF). The RF emissions from these components may interfere with proper operation of other components or circuits in the vicinity of these components on the PCB. In this case, it is important to shield these RF emissions in order to prevent RF interference. In addition, it is also possible to shield these RF emissions in order to prevent RF interference to some components or circuits.

For compact electronic devices, such as radiotelephones, a PCB serving as a ground plane may be utilized as a part of a shielding system. An electrically-conductive housing (generally referred to as a "shielding enclosure") that is configured to surround a part to be shielded is generally secured upon the PCB.

Considering a miniaturization demand of the electronic devices, a size of the shielding enclosure, especially, a height above the printed circuit board, is restricted. Therefore, the inventor hereof has recognized a need in the art for a shielding enclosure having a height as low as possible.

SUMMARY

This section provides a general summary of the disclosure, and is not a comprehensive disclosure of its full scope or all of its features.

Disclosed herein are various exemplary embodiments of shielding enclosures. In an exemplary embodiment, a shielding enclosure generally includes a frame and a lid. The frame includes vertically extending sidewalls and horizontally inwardly extending lateral flanges therefrom. The lateral flanges define a top opening of the frame and include outwardly extending detent legs. The lid includes a top portion for covering the top opening of the frame. The lid also includes flanges downwardly extending from edges of the top portion. At least one of the flanges has a detent structure, such that when the lid is installed on the frame the detent legs of the frame are engaged by the detent structure.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Figure 1:
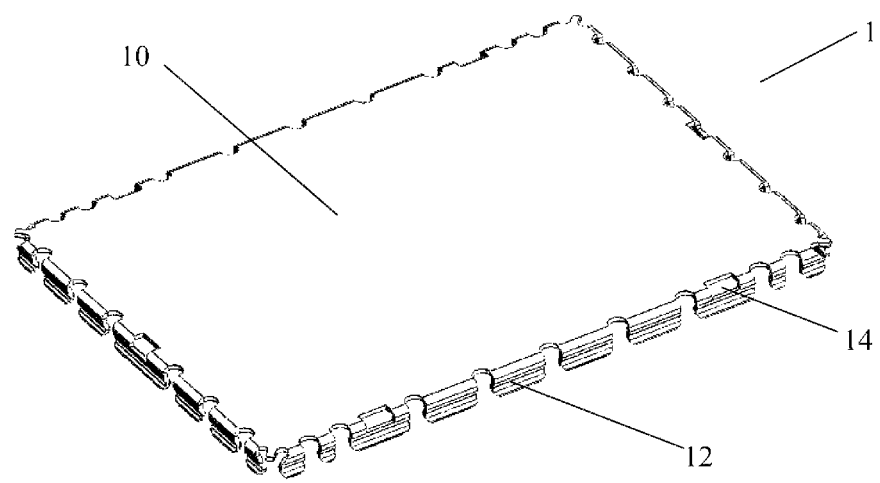
FIG. 1 is a perspective view of a lid of a shielding enclosure in accordance with a first embodiment.

Example embodiments will now be described more fully with reference to the accompanying drawings.

The inventor has disclosed herein exemplary embodiments of shielding enclosures or assemblies that have a reduced or lower height for electronic components and/or circuits on a printed circuit board. The shielding enclosures are configured to have good or better shielding performance, reduced manufacturing and installation costs and/or reduced stress applied on the shielding enclosure during installation.

In an exemplary embodiment, a shielding enclosure or assembly includes a frame having vertically extending sidewalls and horizontally inwardly extending lateral flanges therefrom. The lateral flanges define a top opening of the frame and have horizontally outwardly extending detent legs. The shielding enclosure also includes a lid having a cover board or top portion for covering the top opening of the frame and at least one flange downwardly extending from an edge of the cover board. At least one of the lid's flanges has a detent structure, such that when the lid is installed on the frame, the detent legs of the frame are locked by the detent structures.

Horizontally outwardly extending detent legs are provided on the frame of the shielding enclosure. Directly downwardly extending flanges are provided on edges of the cover board or portion of the lid. The detent positioning of the frame and the lid is achieved by the detent legs and the detent structure on the flanges. As such, upwardly extending flanges are not provided on or required for the frame and the lid of the shielding enclosures disclosed herein. Because upwardly extending flanges are not needed or required, the base portions supporting the flanges may be eliminated, and thus a lowest height for forming the frame and lid is allowed, thereby reducing the overall height of the shielding enclosure.

In an alternative embodiment, the detent structures on the lid of the shielding enclosure may be detent slots on the flanges of the lid. When the lid is installed on the frame, the detent legs of the frame extend to the detent slots of the vertical flanges of the lid and are locked by the detent slots. In this embodiment, the detent structures are the downwardly extending flanges of the lid and the detent legs of the top portion of the frame. After the installation of the frame and the lid is completed, bottom surfaces of the detent legs abut against bottom surfaces of the detent slots. Thus, it is only required that the height of the sidewalls of the frame allows the detent legs on the top portion thereof slightly away form the PCB, thereby allowing the detent legs to be inserted and engaged into the detent slots of the lid. In this case, the overall height of the shielding enclosure is used to dispose the detent structure without any waste, thereby reducing the height of the shielded enclosure in a most effective way.

Alternatively, the detent structures on the lid of a shielding enclosure may be detent protrusions disposed on flanges of the lid, which detent protrusions protrude to the inner portion of the shielding enclosure. The detent protrusions engage with the detent legs of the frame's sidewalls from underneath when the lid is installed on the frame. The lid is firmly fixed on the frame by means of the engagement between the detent legs and the detent protrusions and elastic contact between each flange and the sidewall of the frame.

The detent protrusions may adopt a variety of shapes. In a preferred embodiment, the detent protrusions have a planar upper or top surface and an arc-shaped side surface. Such detent protrusions are namely as semi-nest like protrusions. The arc-shaped side surface is substantially a quarter of a spherical surface. Such detent protrusions may be manufactured by a simple stamping process. During the process of installing the lid to the frame, the arc-shaped side surface can easily slide over the detent legs, and thus allowing the installation of the lid and the frame to be completed with a smaller installation force.

When the lid is installed on the frame, the lateral flanges of the frame contact the cover portion or top surface of the lid. And, the bottom surfaces of the detent legs of the frame contact the upper surfaces of the detent protrusions. Also, outer side surfaces of the detent legs of the frame may also contact inner surfaces of the flanges of the lid. Therefore, the lid and the frame are tightly contacted with each other in any direction, thereby obtaining a very firm detent engagement. This can effectively prevent relative vibration between the lid and the frame.

Furthermore, the flanges of the lid preferably serve as contact springs. After the lid is installed on the frame, the lid's flanges contact the sidewalls of the frame with an elastic force to cause the lid to be closely in contact with the frame, thereby effectively avoiding the vibration of the lid relative to the frame.

Figure 2:
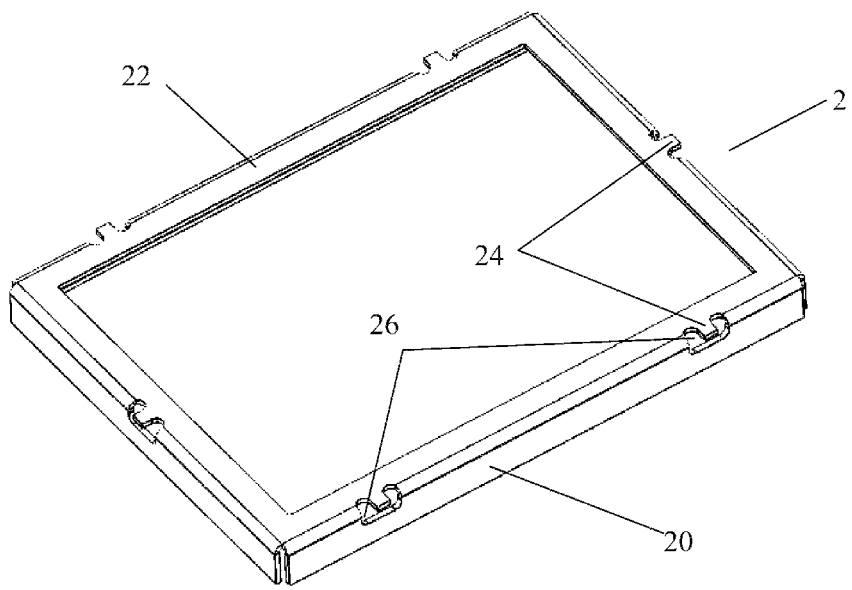
FIG. 2 is a perspective view of a frame of the shielding enclosure in accordance with the first embodiment.
Figure 3:
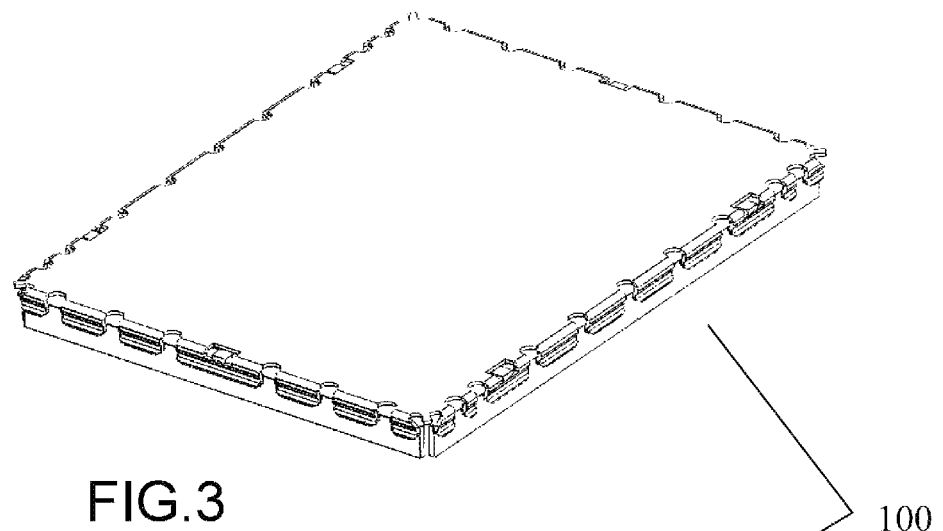
FIG. 3 is a perspective view of the shielding enclosure, and illustrating the lid shown in FIG. 1 installed to the frame shown in FIG. 2.
Figure 4:
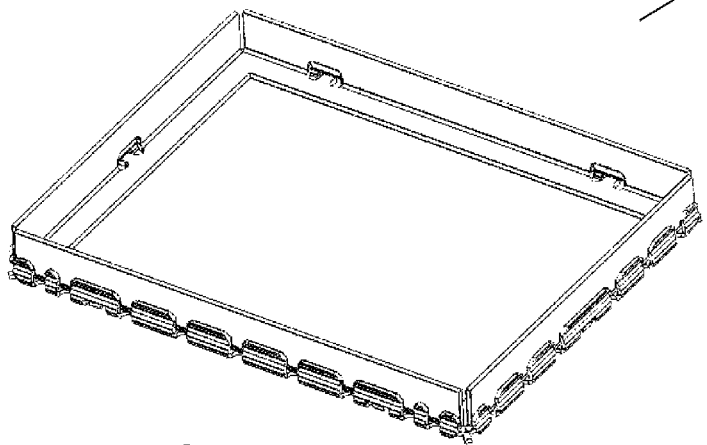
FIG. 4 is a perspective view of the shielding enclosure shown in FIG. 3 viewed from the bottom.
Figure 5:
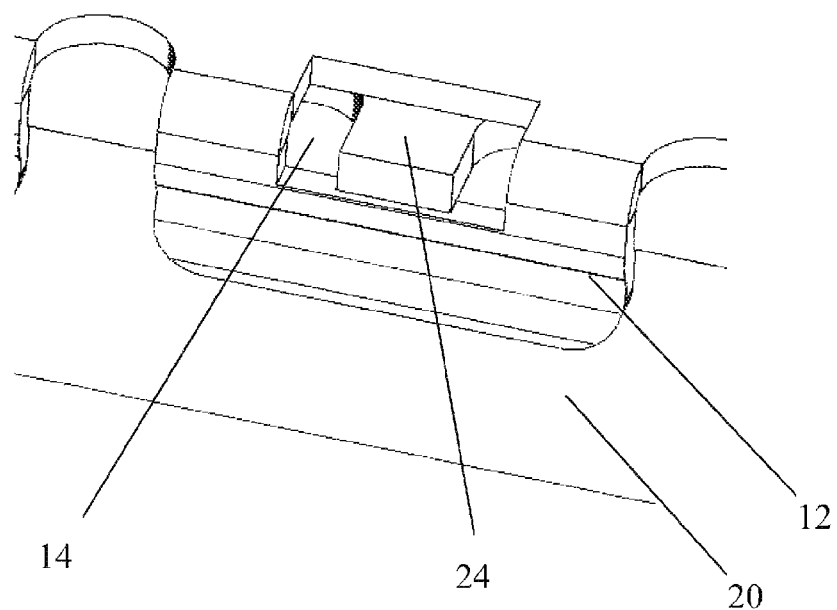
FIG. 5 is a partially enlarged view of a portion of the shielding enclosure shown in FIG. 3, and illustrating the engagement of a detent leg of the frame within an opening of the lid.

Referring now to the drawings, FIGS. 1 through 5 illustrate a first exemplary embodiment of a shielding enclosure 100 embodying one or more aspects of the present disclosure. As shown in FIGS. 1 and 2, respectively, the shielding enclosure includes a lid 1 and a frame 2. The lid 1 and the frame 2 may be generally made of an electrically-conductive sheet metal, the same or different material, or other suitable materials.

As shown in FIG. 2, the frame 2 is generally rectangular or square. But the frame 2 also can adopt other shapes as needed. When the frame 2 is horizontally placed on a PCB (not shown), the frame 2 is configured to attach bottom ends of its four vertical sidewalls 20 to the PCB so as to surround one or more electronic components or circuits (not shown) of the PCB.

The frame 2 includes a lateral flange 22 extending to the inner portion of the frame 2. The lateral flange 22 is provided or formed at a top of each of the sidewalls 20. Four lateral flanges 22 are connected in sequence with each other to form an integral structure, thereby defining a top opening of the frame 2. Generally, the frame 2 is formed of a single piece of a electrically-conductive sheet metal. At least one detent leg 24 horizontally extending to the outside of the frame is provided on each of the lateral flanges 22. In this illustrated embodiment, the detent legs 24 and the lateral flanges 22 are coplanar, and provided on the top of the frame 2. Sidewall openings 26 are defined on sidewalls 20 under the detent legs 24. The detent legs 24 above the sidewall openings 26 form a cantilever structure, such that the detent legs 24 are able to perform elastic deformation along an up and down direction.

The lid 1 may also be formed of a single piece of an electrically-conductive sheet metal. The shape of the lid 1 corresponds to the shape of the frame 2. As illustrated in FIG. 1, the lid 1 includes a substantially planar top cover portion 10 and a plurality of flanges 12 downwardly extending from four edges of the lid 1. The flanges 12 are at least provided at the positions of the lid 1 corresponding to the detent legs 24 of the frame 2 and also can be preferably provided at other positions.

The lid 1 includes detent slots 14 that serve as detent structures. The detent slots 14 are defined on the flanges 12 corresponding to the detent legs 24. The detent slots 14 cooperate with the detent legs 24 of the frame 2 as disclosed herein.

Generally, the detent slots 14 are typically openings through the flanges 12. But the detent slots 14 may instead merely be concaved portions of the flanges 12. As illustrated in FIG. 1, the illustrated lid 1 includes rectangular openings defined on the flanges 12 of the lid 1 that cooperate with the detent legs 24 as described hereinafter.

A distance from the bottom surface of the openings or slots 14 to the bottom surface of the top cover portion 10 is equal to or slightly larger than a thickness of the detent legs 24 in an up and down direction (namely, a thickness of the lateral flange 22 of the frame). A width of the openings or slots 14 is equal to or slightly larger than a width of the detent legs 24 in order to ensure the detent legs 24 are able to relatively easily enter into the opening or slot 14. A height of the portion of the flanges 12 under the opening or slot 14 is configured to provide certain engagement strength, and the overall height of the lid's flanges 12 is smaller than or equal to a height of the sidewalls 20 of the frame 2.

During the process of installing the lid 1 onto the frame 2 so as to form the shielding enclosure 100, elastic deformation of both the flanges 12 of the lid 1 and the detent legs 24 of the frame 2 occur after they contact each other. This elastic deformation includes the flanges 12 moving or being offset outwardly and the detent legs 24 moving or being offset downwardly. After a portion of the flanges 12 under the openings elastically passes over the detent legs 24, the detent legs 24 enter the openings or slots 26 and partially or completely recover to their original shape. The bottom surface of the detent legs 24 can be engaged with the bottom surface of the openings or slots 26 so as to prevent or inhibit the lid 1 from being removed inadvertently from the frame 2 upwardly. Herein, the elastic deformation of the detent legs 24 may not occur. Preferably a certain lateral elastic deformation of the flanges 12 is retained to be able to contact with the sidewalls 20 of the frame 2 with a certain elastic force. This facilitates to obtain a firm detent.

In this embodiment, upwardly extending flanges are not provided on the frame 2 and the lid 1. Thus, there is no need to provide base portions for the flanges. Thus, when the lid 1 and the frame 2 having the structure described above and illustrated in FIGS. 1 through 5 are engaged in an installed position, a height of the formed shielding enclosure 100 merely substantially depends on a height of the sidewalls 20 of the frame 2. Thereby, a shielding enclosure having a reduced height may be obtained. Further, a width of the flanges 12 of the lid 1 is at least equal to a width of the sidewall openings or slots 26 of the frame 2. Thus, a significant portion (e.g., most, etc.) of the sidewall openings 26 of the frame 2 are covered by the flanges 12 of the lid 1, and thus an area of a passage in and out of the shielding enclosure 100 is reduced. This facilitates and improves shielding of electromagnetic radiation and reduces moisture into the shielding enclosure 100.

At least part of the flanges 12 of the lid 1 may be configured to have a shape as follows. That is, a surface of the flanges 12 in the inner side facing a coverage area of the lid 1 is formed as a curved surface. The curved surface is an arc-shaped surface protruding to the inner side of the lid 1. An innermost peak of the arc-shaped surface towards the inner side of the lid 1 is higher than a bottom end of the flange 12, that is, higher than a lowermost edge of the arc-shaped surface. As shown in FIG. 1, the peak of the arc-shaped surface of the flanges 12 of the lid 1, when not installed, slightly offsets inwardly relative to an outer surface of the sidewalls 20 of the frame 2. The flanges 12 of the lid 1 in this embodiment thus form contact springs. During the process of installing the lid 1 onto the frame 2, the arc-shaped surface of flanges 12 contacts with the outer surface of the sidewalls 20 and elastic deformation of the flanges 12 occurs. This allows the flanges 12 to easily slide downwardly to the installed position by means of the arc-shaped surface. When the lid 1 is in the installed position, the flanges 12, serving as contact springs, contact the sidewalls 20 of the frame 2 with a certain elastic force. This can effectively avoid or reduce vibration of the lid 1 on the frame 2.

As illustrated in FIG. 1, each side of the lid 1 has a plurality of flanges 12, and cutouts are formed between adjacent flanges 12. This facilitates that each flange 12 can form the contact spring that elastically contacts with the sidewalls 20 of the frame 2. Since multipoint elastic contact is formed at each side of the frame 2 and the lid 1, the combined force between the frame 2 and the lid 1 can be further enhanced, thereby preventing or inhibiting relative vibration therebetween.

In one example embodiment, the lid 1 is formed from a metal sheet having a thickness of 0.1 millimeters (mm). The lid 1 has an overall height of 0.7 mm. Continuing with this example, the frame 2 is formed from a metal sheet having a thickness of 0.2 mm. The frame 2 has an overall height of 0.8 mm. In this example then, the installed shielding enclosure 100 has a height of 0.9 mm. In order to have a suitable contact elastic force between the flanges 12 of the lid 1 and the sidewalls 20 of the frame 2, a width of the flanges 12 is in a range from 0.6 mm to 3 mm. As can be seen from FIG. 1, the width of each of the flanges 12 can be different. But each flange may also be configured with the same width in other embodiments. With continued reference to FIGS. 1 and 2, the flanges 12 used to cooperate with the detent legs 24 have a larger width because the detent slots 26 need to be provided thereon, and the width should be large enough to at least receive the detent legs 24. In addition, considering structural strength of the engaged lid 1 and frame 2 and shielding performance of such formed shielding enclosure 100, the width of the detent legs is preferably in a range from 0.8 mm to 2.5 mm in this example. The dimensions provided herein are for purposes of illustration only, as a shielding enclosure may be sized differently with larger or smaller dimensions depending, for example, on the particular application, such as the components to be shielded, space considerations within the overall device, shielding and heat dissipation needs, and other factors.

Figure 6:
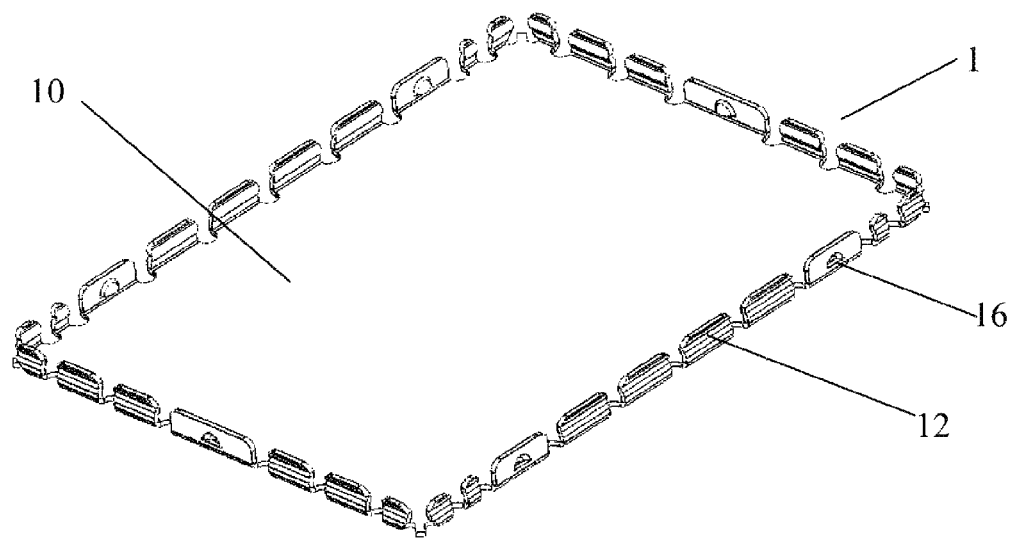
FIG. 6 is a perspective view of a lid of a shielding enclosure in accordance with a second embodiment.

FIGS. 6 through 9 illustrate a second exemplary embodiment of a shielding enclosure embodying one or more aspects of the present disclosure. FIG. 6 illustrates the lid 1 of the shielding enclosure of the second embodiment. The frame 2 of the second embodiment is the same as the frame 2 shown in FIG. 2. In this second embodiment, the lid 1 includes flanges 12 that corresponding to the frame's detent legs 24. But the lid's flanges 12 now include detent protrusions 16 instead of slots as the detent structures.

Figure 7:
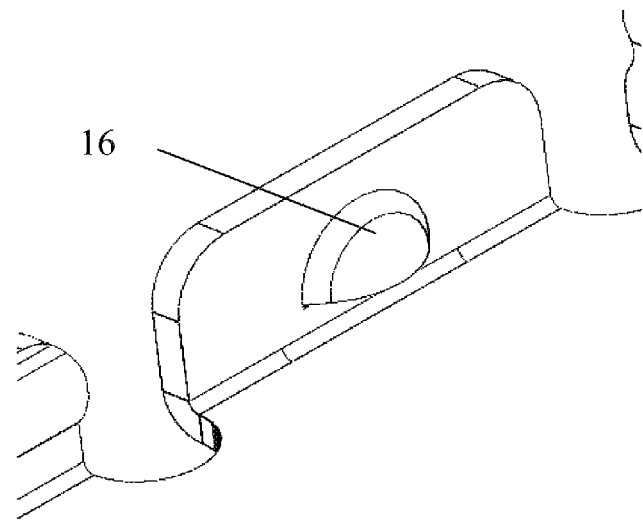
FIG. 7 is a partially enlarged view of a portion of the lid shown in FIG. 6, and illustrating a detent protrusion protruding inwardly from an inner surface of a flange of the lid.
Figure 8:
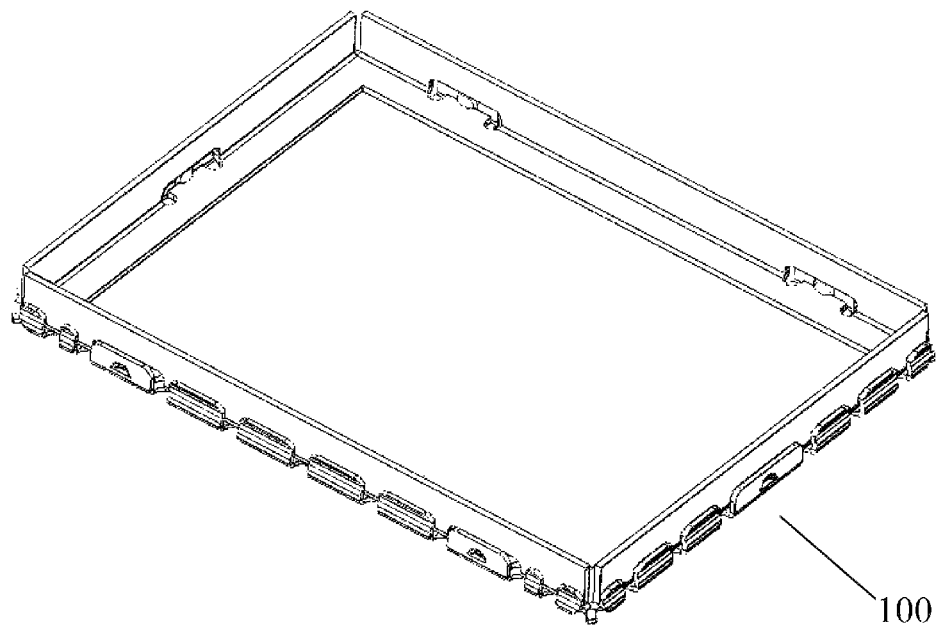
FIG. 8 is a perspective view of the shielding enclosure in accordance with the second embodiment, and illustrating the lid shown in FIG. 6 installed to a frame.
Figure 9:
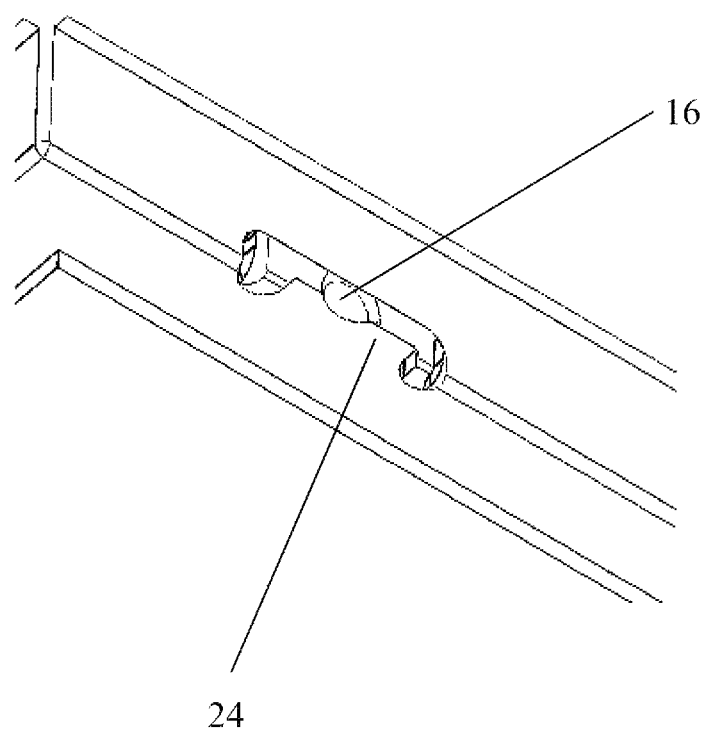
FIG. 9 is a partially enlarged view of a portion of the shielding enclosure shown in FIG. 8, and illustrating the engagement of a detent leg of the frame within a detent protrusion of the lid.

As illustrated in FIGS. 6 and 7, the lid's detent protrusions 16 protrude to the inner side of the lid 1. The detent protrusions 16 are formed on inner surfaces of the flanges 12 that cooperate with the detent legs 24 of the frame 2. As shown in FIG. 9, the detent protrusions 16 are used to engage the bottom surface of the frame's detent legs 24 from undersides of the detent legs 24 when the lid 1 is installed on the frame 2, thereby locking the detent legs 24.

The detent protrusions 16 may be any suitable shape to achieve their detent function. In the illustrated embodiment, the detent protrusions 16 have a planar upper or top surface which facilitates to avoid disengagement of the detent legs 24 and the detent protrusions 16. The detent protrusions 16 may adopt an arc-shaped side surface from bottom to top. During the process of installing the lid 1 to the frame 2, the arc-shaped side surface elastically slides over the detent legs 24 and thus the installation is completed with a smaller installation force.

In order to facilitate manufacturing, the lid's flanges 12 may be processed from outside using a tool having approximately hemisphere-shaped protrusions. The top surface of the obtained detent protrusions 16 is substantially semi-circular and the side surface thereof is arc-shaped. Such protrusions also can be named as semi-nest like protrusions.

With the lid 1 installed on the frame 2, the detent legs 24 of the frame 2 are wedged between the top cover portion 10 of the lid 1 and the detent protrusions 16. Elastic contact may also be formed between the inner side surfaces of the flanges 12 and the detent legs 24. For example, elastic contact may be formed between the flanges 12 and the free ends of the detent legs 24 as shown in FIG. 9. Thus, the flanges 12 here actually also can be contact springs like other flanges.

The shielding enclosure of this second embodiment may also allow for a small height and vibration of the lid 1 on the frame 2 can be avoided or reduced via the multipoint elastic contact formed on each side of the shielding enclosure.

By way of example, this second embodiment of the shielding enclosure may be dimensionally sized such that the width of the flanges 12 of the lid 1 is in a range from 0.6 mm to 3 mm, and the width of the detent legs 24 is in a range from 0.8 mm to 2.5 mm. The flanges 12 of the lid 1 that cooperate with the detent legs 24 of the frame are wider than the detent legs 24.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter. The disclosure of a first value and a second value for a given parameter can be interpreted as disclosing that any value between the first and second values could also be employed for the given parameter. Similarly, it is envisioned that disclosure of two or more ranges of values for a parameter (whether such ranges are nested, overlapping or distinct) subsume all possible combination of ranges for the value that might be claimed using endpoints of the disclosed ranges.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A shielding enclosure comprising:
    a frame including vertically extending sidewalls and horizontally inwardly extending lateral flanges therefrom, the lateral flanges defining a top opening of the frame and including outwardly extending detent legs; and
    a lid including a top portion for covering the top opening of the frame and flanges downwardly extending from edges of the top portion, at least one of the flanges having a detent structure, and wherein each side of the lid has a plurality of the flanges and cutouts are formed between adjacent flanges such that the flanges form contact springs;

wherein upwardly extending flanges are not provided on the frame and the lid of the shielding enclosure; and whereby the detent legs of the frame are engaged by the detent structure when the lid is installed on the frame and the flanges, serving as contact springs, contact with the sidewalls of the frame with an elastic force.

2. The shielding enclosure according to claim 1, wherein: the detent structure of the lid comprise detent slots on the flanges of the lid; and
the detent legs of the frame extend into the detent slots to be locked by the detent slots when the lid is installed on the frame.

3. The shielding enclosure according to claim 2, wherein: the detent slots are rectangular; and
bottom surfaces of the detent legs contact bottom surfaces of the detent slots when the lid is installed on the frame.

4. The shielding enclosure according to claim 1, wherein the at least one flange of the lid is in contact with an outer surface of the sidewalls of the frame with an elastic force when the lid is installed on the frame.

5. The shielding enclosure according to claim 1, wherein inwardly facing surfaces of the flanges of the lid are formed as arc-shaped surfaces protruding inwardly relative to the lid.

6. The shielding enclosure according to claim 5, wherein: the arc-shaped surfaces have innermost peaks towards the inner side of the lid; and
the peaks are higher than bottom ends of the flanges.

7. The shielding enclosure according to claim 1, wherein: the detent structure of the lid comprise detent protrusions on the flanges protruding inwardly relative to the lid; and
the detent protrusions engage the detent legs from underneath and lock the detent legs when the lid is installed on the frame.

8. The shielding enclosure according to claim 7, wherein the detent protrusions have planar upper surfaces.

9. The shielding enclosure according to claim 8, wherein the upper surfaces of the detent protrusions are substantially semi-circular.

10. The shielding enclosure according to claim 7, wherein: the detent protrusions have arc-shaped side surfaces; and
the arc-shaped side surfaces are configured to pass by the detent legs during the process of installing the lid to the frame.

11. The shielding enclosure according to claim 7, wherein when the lid is installed on the frame:
bottom surfaces of the detent legs are in contact with upper surfaces of the detent protrusions; and
outer surfaces of the detent legs are in contact with inner surfaces of the flanges of the lid.

12. The shielding enclosure according to claim 7, wherein: inwardly facing surfaces of the flanges of the lid without the detent protrusions are formed as arc-shaped surfaces protruding inwardly relative to the lid; and
innermost peaks of the arc-shaped surfaces are higher than ends of the flanges of the lid.

13. The shielding enclosure according to claim 1, wherein: the frame includes sidewall openings under the detent legs; and
the detent legs form cantilever structures above the sidewall openings.

14. The shielding enclosure according to claim 13, wherein a width of the flanges of the lid having the detent structure is larger than or equal to the width of the sidewall openings under the corresponding detent legs.

15. The shielding enclosure according to claim 1, wherein: the frame and the lid are quadrilateral;
each side of the frame has at least one detent leg; and
when the lid is installed on the frame, the at least one flange of the lid is elastically in contact with an outer surface of the sidewalls of the frame.

16. The shielding enclosure according to claim 1, wherein: a width of the flanges of the lid is in a range from 0.6 millimeters to 3 millimeters;
a width of the detent legs is in a range from 0.8 millimeters to 2.5 millimeters; and
the width of the flanges of the lid that cooperate with the detent legs is larger than that of the corresponding detent legs.

17. A shielding enclosure comprising:
a frame including vertically extending sidewalls and horizontally inwardly extending lateral flanges therefrom, the lateral flanges defining a top opening of the frame and including outwardly extending detent legs, the frame including sidewall openings under the detent legs such that the detent legs form cantilever structures above the sidewall openings; and
a lid including a top portion for covering the top opening of the frame, flanges downwardly extending from edges of the top portion, and detent slots on at least one of the flanges, wherein each side of the lid has a plurality of the flanges and cutouts are formed between adjacent flanges such that the flanges form contact springs;
wherein upwardly extending flanges are not provided on the frame and the lid of the shielding enclosure;
whereby when the lid is installed on the frame:
the detent legs of the frame extend into the detent slots;
bottom surfaces of the detent legs contact bottom surfaces of the detent slots; and
the flanges, serving as contact springs, are in elastic contact with an outer surface of the sidewalls of the frame with an elastic force.

18. The shielding enclosure according to claim 17, wherein:
inwardly facing surfaces of the flanges of the lid are formed as arc-shaped surfaces protruding inwardly relative to the lid;
the arc-shaped surfaces have innermost peaks towards the inner side of the lid;
the peaks are higher than bottom ends of the flanges; and
a width of the flanges of the lid having the detent slots is larger than or equal to the width of the sidewall openings under the corresponding detent legs.

19. A shielding enclosure comprising:
a frame including vertically extending sidewalls and horizontally inwardly extending lateral flanges therefrom, the lateral flanges defining a top opening of the frame and including outwardly extending detent legs, the frame including sidewall openings under the detent legs such that the detent legs form cantilever structures above the sidewall openings; and
a lid including a top portion for covering the top opening of the frame, flanges downwardly extending from edges of the top portion, and detent protrusions on at least one of the flanges protruding inwardly relative to the lid, wherein each side of the lid has a plurality of the flanges and cutouts are formed between adjacent flanges such that the flanges form contact springs;
wherein upwardly extending flanges are not provided on the frame and the lid of the shielding enclosure; and
whereby when the lid is installed on the frame, the detent protrusions engage the detent legs from underneath such that the detent legs are wedged between the lid's top portion and the detent protrusions and the flanges, serving as contact springs, contact with the sidewalls of the frame with an elastic force.

20. The shielding enclosure according to claim 19, wherein:
   the detent protrusions have planar top surfaces, upper surfaces that are substantially semi-circular; and/or arc-shaped side surfaces;
   bottom surfaces of the detent legs are in contact with upper surfaces of the detent protrusions when the lid is installed on the frame;
   inwardly facing surfaces of the flanges of the lid are formed as arc-shaped surfaces protruding inwardly relative to the lid;
   innermost peaks of the arc-shaped surfaces are higher than ends of the flanges of the lid; and
   a width of the flanges of the lid having the detent protrusions is larger than or equal to the width of the sidewall openings under the corresponding detent legs.

* * * * *